United States Patent [19]

Hendricks

[11] Patent Number: 4,687,879
[45] Date of Patent: Aug. 18, 1987

[54] TIERED THERMOELECTRIC UNIT AND METHOD OF FABRICATING SAME

[75] Inventor: Terry J. Hendricks, Garland, Tex.

[73] Assignee: Varo, Inc., Garland, Tex.

[21] Appl. No.: 727,341

[22] Filed: Apr. 25, 1985

[51] Int. Cl.⁴ .............................................. H01L 35/28
[52] U.S. Cl. ..................................... 136/212; 136/225
[58] Field of Search ................................ 136/212–215, 136/225, 206; 62/3

[56]     References Cited
U.S. PATENT DOCUMENTS

| | | |
|---|---|---|
| 1,848,655 | 3/1932 | Petrik . |
| 2,944,404 | 7/1960 | Fritts . |
| 2,980,746 | 4/1961 | Claydon . |
| 3,076,051 | 1/1963 | Haba . |
| 3,083,248 | 3/1983 | Schumacher . |
| 3,111,432 | 11/1963 | Sickert et al. . |
| 3,197,844 | 8/1965 | Bassett, Jr. . |
| 3,240,628 | 3/1966 | Sonntag, Jr. . |
| 3,276,105 | 10/1966 | Alais et al. . |
| 3,291,648 | 12/1966 | Sheard et al. . |
| 3,314,242 | 4/1967 | Lefferts . |
| 3,326,726 | 6/1967 | Bassett, Jr. et al. . |
| 3,450,572 | 6/1969 | Rietveid . |
| 3,509,620 | 5/1970 | Phillips . |
| 3,560,351 | 2/1971 | Abbott et al. . |
| 3,626,583 | 12/1971 | Abbott et al. . |
| 3,780,425 | 12/1973 | Penn et al. . |
| 3,781,176 | 12/1973 | Penn et al. . |
| 4,149,025 | 4/1979 | Niculescu . |
| 4,465,894 | 8/1984 | Reyes .................................. 136/212 |
| 4,493,939 | 1/1985 | Blaske et al. ........................ 136/212 |

Primary Examiner—Deborah L. Kyle
Assistant Examiner—T. J. Wallen
Attorney, Agent, or Firm—Jerry W. Mills; Roger N. Chauza

[57]     ABSTRACT

A thermoelectric unit is disclosed having superposed PN semiconductor thermoelectric stages (10, 12) thermally and electrically connected together by a planar ceramic coupler (14) therebetween. The PN semiconductor blocks (16, 18) of each stage are connected by metallic bridging elements (20), which bridging elements are soldered to isolated metallized areas (40) on each face surface of the ceramic coupler (14) to thereby form a thermal path between the stages. Each stage further includes power source tabs (22,24; 26,28), the tabs (26,28) of one stage receiving power from the other stage through electrically conductive metallized edge paths (42, 44) on the ceramic coupler (14). This forms an interstage connection for connecting the PN semiconductor blocks of the one stage to the PN semiconductor blocks of the other stage.

26 Claims, 5 Drawing Figures

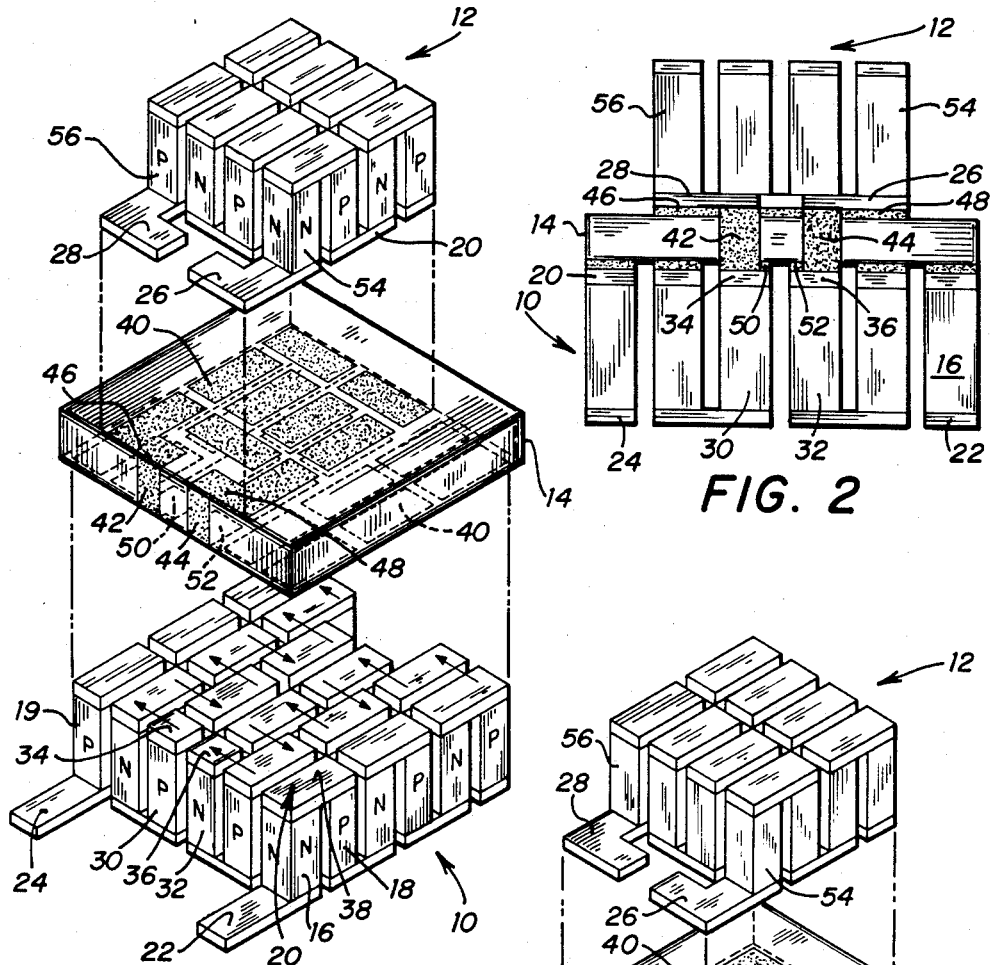
FIG. 1
FIG. 2
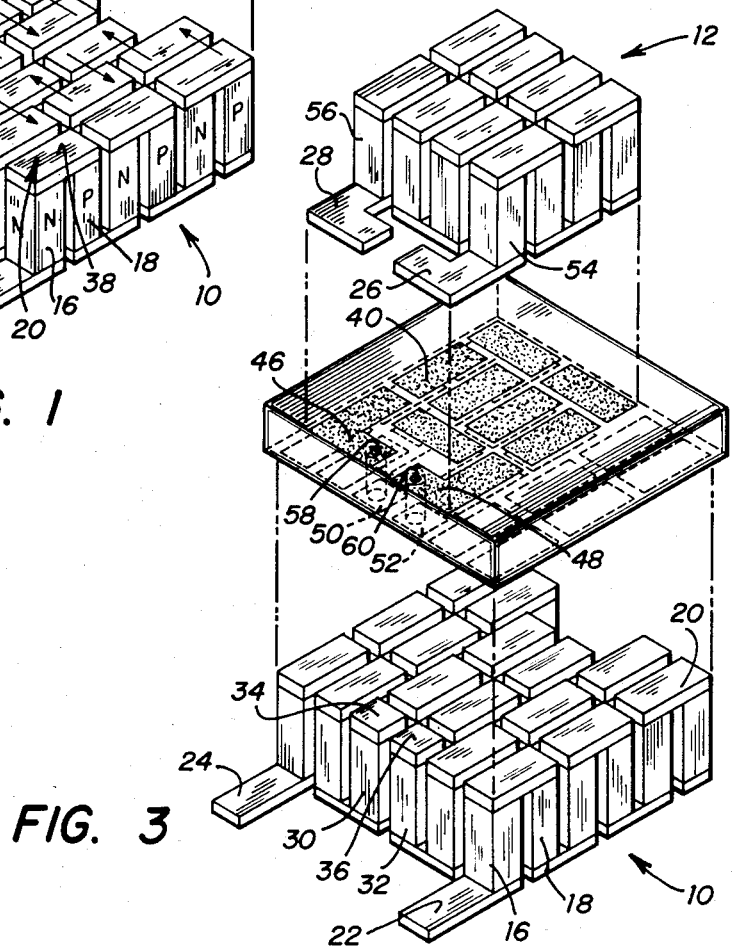
FIG. 3

TIERED THERMOELECTRIC UNIT AND METHOD OF FABRICATING SAME

TECHNICAL FIELD OF THE INVENTION

The present invention relates to thermoelectric devices, and more particularly relates to plural thermoelectric stages stacked together to effect an overall greater temperature gradient using the Peltier and Seebeck principles.

BACKGROUND OF THE INVENTION

The use of semiconductors as thermoelectric devices is well known in the art. Likewise, it is a common practice to arrange many P-type semiconductor thermal elements together with corresponding N-type thermal elements to form a side-by-side array and thus achieve an additive effect on the transfer of heat therethrough. U.S. Pat. No. 4,493,939, assigned to the assignee hereof, discloses such an array of thermal elements.

As noted in U.S. Pat. No. 4,493,939, one array of PN thermal elements may be stacked on top of another such array to effect an increased temperature gradient across the total stacked device. The stacking of PN thermal element arrays in a tiered manner poses a challenge insofar as electrical insulation must be maintained between the individual arrays, as well as a high degree of thermal conductivity to achieve an overall optimum transfer of heat.

The above-referenced patent discloses the use of a copper sheet epoxied between the tiered stages, the copper sheet providing increased thermal conductivity while the epoxy electrically isolates the one stage from the other. However, the method disclosed therein of tiering stages of PN thermal elements is labor intensive and, in addition, it is of critical importance that the epoxy in its uncured state and the thickness thereof be carefully controlled to provide a strong bond. Also, the clearances between the stages and the copper plate must be carefully controlled to prevent electrical short circuits with the thermoelectric stages. It is also apparent that by connecting the stages together with external wires, the process is labor intensive and not readily amenable to machine assembly.

A need has thus arisen for a method and apparatus for improving the thermal performance between connected tiers of thermoelectric stages (over that anticipated by a device described in U.S. Pat. No. 4,493,939), as well as methods of fabrication applicable to mass production techniques.

SUMMARY OF THE INVENTION

In accordance with the present invention, a method and apparatus are provided which substantially eliminate or reduce the problems associated with the prior art techniques.

In accordance with the present invention, a method of fabricating a tiered stack of thermoelectric devices includes the provision of a thermally conductive but electrically isolating coupler, such as ceramic, bonded between the stacked arrays. A metallized path on the ceramic coupler serves as an electrical circuit between one side of the coupler and the other, which path is reflow soldered to electrical power source tabs of the stacked stages to provide electrical continuity between the stages, while also insuring efficient thermal conductance between the stages.

In accordance with another aspect of the invention, the bonding and the thermal conductivity between the stacked PN thermoelectric stages is enhanced by providing solderable bridging elements for connecting pairs of P-type and N-type semiconductor blocks together. The unit is then completed by soldering the bridging elements of the stages directly to solderable isolated contact areas formed on the ceramic coupler.

In accordance with yet another aspect of the invention, the bridging elements can be eliminated and a solder paste, or other similar metallic bonding material, can be applied to the isolated contact areas on the ceramic coupler which then serve as the electrical bridging elements, as well as the electrical paths. The entire unit is completed by reflow soldering.

BRIEF DESCRIPTION OF THE DRAWINGS

Further objects and features of the present invention will become apparent from the description of an illustrative embodiment thereof, taken in conjunction with the accompanying drawings, in which:

FIG. 1 is an isometric view of the invention with the thermoelectric stages removed from the planar thermal coupler for pictorial clarity;

FIG. 2 is a side elevational view of the invention illustrating the metallization path around the planar thermal coupler edge for electrically connecting the top thermoelectric stage to the bottom stage;

FIG. 3 is an isometric view of the invention, with the thermoelectric stages separated from the thermal coupler, and illustrates an alternative interstage electrical connection in the nature of plated-through apertures in the thermal coupler;

DETAILED DESCRIPTION OF THE INVENTION

Figure 4:
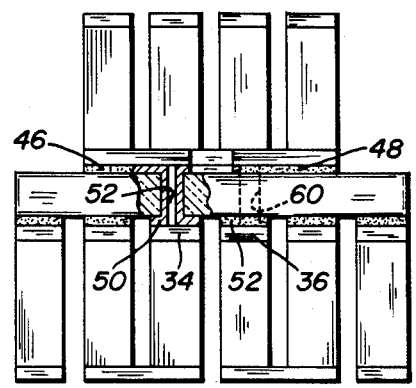
FIG. 4 is a side elevational view of the thermoelectric unit partially sectioned to show the plated-through innerstage electrical connections of FIG. 3

The present invention is concerned primarily with a method and apparatus for electrically and thermally joining one thermoelectric stage to another. The principles of the invention are ideally suited, but not restricted, to the use of P and N semiconductor elements joined together to form a thermoelectric stage.

With reference now to FIG. 1, there is illustrated the principles of the invention according to the preferred embodiment thereof. The major elements of the invention comprise a first thermoelectric stage generally designated by reference character 10, a second thermoelectric stage 12 tiered or stacked above the first stage 10, and a unitary planar thermal coupler 14 interposed between the stages for thermally coupling such stages together.

In the preferred embodiment of the invention, the first and second thermoelectric stages 10 and 12 are constructed with a plurality of N conductivity type semiconductor blocks 16 connected to adjacent P-type semiconductor blocks 18 by planar electrical bridging elements 20. A power source tab 22 is connected to the bottom of one semiconductor block 16 to provide either a source or return of electrical power to the thermoelectric stage 10. A second power source tab 24 is associated with power source tab 22 and is connected to the bottom of P-type block 19 to complete the electrical circuit for either the stage or the entire unit.

Figure 5:
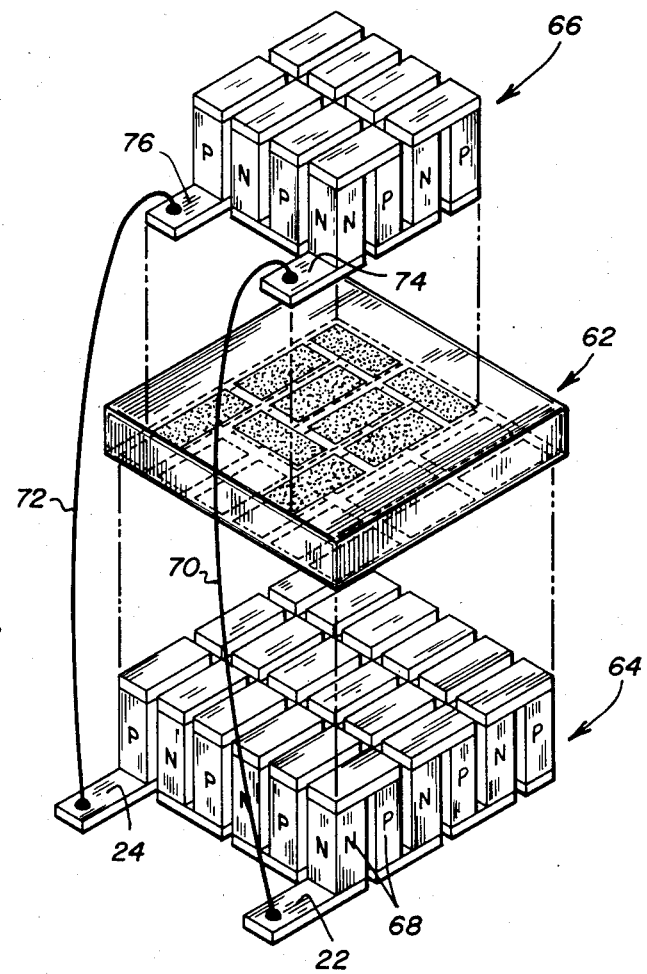
FIG. 5 is an isometric view of the thermoelectric stages separated from the ceramic coupler illustrating the metallized pattern on the coupler for thermally connecting each stage together, and with external electrical connections from one stage to the other.

The second thermoelectric stage 12 of the unit is constructed similarly to that of the first stage 10, and includes power source tabs 26 and 28 connected to the bottom of blocks for entry or exit of electrical power to that stage. While the invention of FIG. 1 is depicted with the first thermoelectric stage 10 electrically connected through the edge metallization on the planar thermal coupler 14 in series with the second stage 12, the stages could operate with equal effectiveness when connected in parallel as shown in FIG. 5, to be subsequently described. In addition, the principles and concepts of the invention may be applied with equal effectiveness when stacking more than two thermoelectric stages together to form a unit having the capability of a greater temperature gradient thereacross.

In the embodiment of FIG. 1, the first thermoelectric stage 10 contains an unpaired P-type semiconductor block 30 and an unpaired N-type semiconductor block 32, thereby enabling the first thermoelectric stage 10 to be supplied with current through power source tabs 22 and 24 on the bottom side thereof, and connected to the second thermoelectric stage 12 through interstage electrical connection pads 34 and 36. The arrows in FIG. 1 between the thermal blocks of the first stage 10 indicate the direction of current flow between the PN block pairs such that current passes through all blocks.

Because the present invention is concerned with the coupling of one thermoelectric stage to another, the disclosure hereof will not be further encumbered with a detailed description of the manner in which the PN thermal blocks generate a temperature gradient when an electrical current is passed therethrough. For additional disclosure of dual stage thermoelectric devices, reference is made to the aforementioned U.S. Pat. No. 4,493,939, the specification of which is herein incorporated by reference.

Therefore, with reference again to FIG. 1 of the drawings, each pair of PN thermal blocks is bridged across the ends thereof with a bridging element 20 formed from suitable material, such as copper, and which is electrically conductive so as to reduce the resistance between the P and N semiconductor blocks. Each bridging element 20 is also thermally conductive to effect an efficient transfer of heat to or from the stage. In addition, it is preferable that the bridging elements 20 be constructed of a material which produces a solderable upper surface 38. The feature of solder bonding the thermoelectric stages to the planar thermal coupler 14 will be discussed in more detail below.

According to an important aspect of the invention, the planar thermal coupler 14 is constructed of a ceramic material, preferably of an aluminum oxide or beryllium oxide material. It has been found that ceramic thermal couplers of thicknesses ranging from 0.01 to 0.5 inch and widths of 0.1 to 3 inches have proved to function very well, both as to operation and manufacturability. The selection of a ceramic material for the thermal coupler has proven to be superior over epoxy material previously utilized, as ceramic has superior heat transfer characteristics over epoxy. For example, aluminum oxide and beryllium oxide are capable of transferring respectively 18–24 and 200 watts per meter per degree Centigrade. In contrast, conventional epoxy materials have the capability of only 1.5–2.5 watts per meter per degree Centigrade. Because the thermoelectric stages are solder bonded to opposing sides of the ceramic thermal coupler 14, the integrity of the composite unit is additionally improved as solder connections are substantially stronger than epoxy connections. Solders suitable for the fabrication of the thermoelectric unit may be pure tin, bismuth tin or indium tin.

As shown in FIG. 1, the ceramic thermal coupler 14 has on its face surfaces thereof isolated metallized areas 40 which correspond to and are in registry with the bridging elements 20 of each thermoelectric stage 10 and 12. Also formed integral with the ceramic thermal coupler 14 are electrical interstage connections comprising edge connnections 42 and 44 whose terminal ends provide metallic pads, such as indicated respectively by reference characters 46 and 48 on the top of the thermal coupler 14, and 50 and 52 on the bottom thereof. Pad 46, for example, is solderable to an associated power source tab 28 of the second thermoelectric stage 12. Thus, each metallic pad 46, 50, and 48, 52 are located on opposing surfaces of the thermal coupler 14 and are connected together by respective metallized edge connections 42 and 44 which wrap around the edge of the thermal coupler 14.

FIG. 2 shows a side view of the metallized edge connections 42 and 44 joining respective metallized pads 46, 50, and 48, 52. A variety of techniques may be utilized to form the various metallized areas 40 and pads 46, 50, 48, 52 onto the ceramic thermal coupler 14 such as deposition and etching. For clarity the figures have been much enlarged, but in practice, the metallized areas and pads are isolated and spaced apart about 3–10 mils, with 5 mils being a typical spacing. Of course, other metallization patterns and spacings may be chosen to accommodate particular needs.

With the noted thermal coupler interstage connections, the PN array of the first thermoelectric stage 10 may be electrically connected to the other PN array of the second thermoelectric stage 12. Specifically, P-type block 30 and N-type block 32 of the first stage 10 include respective interstage connection pads 34 and 36. Power source tabs 26 and 28 serve as respective interstage connection pads to respective N-type block 54 and P-type block 56. Thus current flows upwardly out of N-type block 32 through its connection pad 36, through thermal coupler pads 52, 48 and edge connection 44 and into N-type block 54 through its power source tab 26. Current flows out of the second thermoelectric stage 12 and into the first stage 10 in a similar path downwardly through P-type blocks 56 and 30.

FIGS. 3 and 4 illustrate alternative thermal coupler interstage connections in which the top metallized pads 46 and 48 may be electrically connected to corresponding bottom pads 50 and 52 of the ceramic thermal coupler 14. Throughout the figures it should be understood that like reference characters identify similar structural elements of the invention. Particularly, metallized pad 46 on the top side of the thermal coupler 14 is connected to the metallized pad 50 on the bottom side thereof by a plated through aperture 58. Similarly, pad 48 is connected to pad 52 by plated-through aperture 60.

Another technique for forming the metallized pads and areas is by applying a copper paste to the desired areas on the ceramic thermal coupler 14 and processing it according to conventional techniques for bonding solder paste to the ceramic material, such as by standard screen printing and firing techniques. A metal clad ceramic may also be used wherein the areas 40, pads 46–52 and edge connections 42, 44 may be isolated by chemical etch or laser scribing techniques. According to the methods of the present invention, after the pads and areas are formed, a solder paste is applied to the metallized pattern for subsequent remelting or flowing to electrically and thermally bond such metallized pattern to the respective first and second thermoelectric stages.

From the foregoing, it can be seen that with a metallization pattern on the thermal coupler 14 which coincides with those parts of a thermoelectric stage to or from which it is desired to transfer heat, the ceramic thermal coupler 14 can be extremely effective in transferring heat from one thermoelectric stage to another stacked therewith.

While the thermoelement bridging elements 20 are an aid in maintaining the PN blocks upright and properly oriented during assembly, it is realized that such bridges may be eliminated. With this arrangement, the metallized pattern on thermal coupler 14 is soldered directly to the PN blocks, and thus such pattern areas serve as electrical bridging elements.

In FIG. 5 there is shown another version of the invention in which a ceramic thermal coupler 62 is utilized only as a thermal connection between the first stage 64 and the second stage 66. In the embodiment of FIG. 5 each PN semiconductor block pair 68 is complete within the thermoelectric stage 64 and is not shared between stages as is the extra unpaired N-type semiconductor block 32 and P-type block 30 of the first stage 10 of FIG. 1. It is of no consequence to the transfer of heat that current flows in the same direction through two semiconductor blocks of one type before passing through a block of the other type. While the symmetry of the structure of FIG. 5 may present certain advantages in the manufacture and fabrication of the thermoelectric unit, it is advantageous to electrically connect one thermoelectric stage to another without the use of external connections, such as conductors 70 and 72.

As noted in FIG. 5, when all P-type semiconductor blocks and N-type semiconductor blocks in a given thermoelectric stage are paired, the power source tabs 22 and 24 will both be either on the top or bottom side of such stage. It is possible, of course, to construct the first stage 64 as shown in FIG. 5, and then reverse the positions of the P and N blocks in the second stage 66, whereby the power source tabs 74 and 76 would then be placed at the top side of the second thermoelectric stage 66. This aspect is due primarily to the direction of current flow through the individual semiconductor blocks which dictates the direction of the temperature gradient across the stage. In any event, each stage of the thermoelectric unit of FIG. 5 includes all paired P and N-type semiconductor blocks, and it is preferred to located the power source tabs on the bottom surfaces thereof and externally connect the stages by wires 70 and 72.

In summary, there has been provided a method and apparatus for fabricating a thermoelectric unit having stacked or tiered thermoelectric stages. In particular, a planar ceramic thermal coupler is provided for thermally and electrically coupling one thermoelectric stage in a tiered fashion to another thermoelectric stage. A metallized pattern of electrically isolated areas is formed on both face surfaces of the ceramic thermal coupler, which areas are in registry with and bonded to corresponding PN semiconductor bridging elements through which heat is transferred. Metallized edge connections or plated through apertures and associated pads on the ceramic thermal coupler may also be provided to electrically connect the thermoelectric stages together. The solderable metallized areas on the thermal coupler are soldered to the bridging elements thereby forming an integral thermoelectric unit.

Although the invention has been described above with a certain degree of particularity with respect to the apparatus and the method for fabricating a thermoelectric unit, it should be understood that this disclosure has been made only by way of example. Consequently, changes in the details of the construction and in the arrangement of the elements, as well as in the possible modes of utilization and methods of operation, will be apparent to those familiar with the art and may be resorted to without departing from the scope of the invention as claimed below.

What is claimed is:

1. A method of fabricating a thermoelectric unit employing a first and second thermoelectrc stage of the type having a plurality of first conductivity type elements and a plurality of second conductivity elements electrically connected alternatingly between said first conductivity type elements to form a series of thermal elements, comprising the steps of:

forming a first interstage electrical connection pad on said first stage;

forming a second interstage electrical connection pad on said second stage;

arranging said first and said second thermoelectric stages in a superposed relationship;

interposing a unitary planar thermally conductive and electrically isolating coupler between said first and said second thermoelectric stages;

forming an electrically conductive path on said coupler for connecting said first and said second interstage electrical connection pads together; and bonding the interstage electrical connection pads of said first and said second thermoelectric stage to said conductive path to thereby form an electrical circuit and a thermally conductive path between said stages.

2. The method of claim 1 further including the steps of:

forming a plurality of first electrical bridging elements between adjacent said first and second conductivity type elements of said first stage, said first bridging elements being formed in the same plane as said first interstage electrical connection pad;

forming a plurality of second electrical bridging elements between adjacent first and second conductivity type elements of said second stage, said second bridging elements being formed in the same plane as said second interstage electrical connection pad;

forming a plurality of isolated metallized contact areas in thermal contact with and on opposing sides of said coupler, each area being in registry with a respective one of said first or second electrical bridging elements; and bonding each bridging element to an isolated said contact area in registry therewith.

3. The method of claim 2 wherein said first and said second electrical bridging elements are bonded to respective isolated and metallized areas on said coupler member by soldering.

4. The method of claim 1 further including the steps of:

arranging all said first and second conductivity type elements of said first thermoelectric stage in pairs;

providing an additional first conductivity type element associated with said first stage; and
connecting said first interstage electrical connection pad to said additional first element.

5. The method of claim 4 further including steps of:
providing an additional said second conductivity type element to said first stage unpaired with said additional first conductivity type element;
providing an additional interstage electrical connection pad to said second stage;
providing an additional interstage electrical connection pad to said additional second conductivity type element; and
connecting both said additional interstage electrical connection pads together.

6. The method of claim 1 wherein the electrically conductive path on said coupler is formed thereon by integrally attaching a metallized path around the edge of said coupler.

7. The method of claim 1 wherein the electrically conductive path on said coupler is formed by forming an aperture in said coupler member and metallizing said aperture therethrough.

8. A method of fabricating a thermoelectric unit employing a first and second thermoelectric stage of the type having a plurality of first conductive type elements, a plurality of second conductive type elements electrically connected alternatingly between said first conductivity type elements to form a series of thermal elements, comprising the steps of:
forming a first interstage electrical connection pad on said first stage;
forming a second interstage electrical connection pad on said second stage;
arranging said first and said second thermoelectric stages in a superposed relationship;
forming a plurality of metallized planes having high thermal conductivity on each said thermoelectric stage;
forming a plurality of metallized areas having high thermal conductivity on said coupler in registry with each said metallized plane;
interposing a unitary planar thermally conductive and electrically isolated coupler between said first and said second thermoelectric stages; and
bonding each said metallized plane with one of said metallized areas in registry therewith so as to provide a thermal path from one said thermoelectric stage to the other stage.

9. The method of claim 8 further including the steps of:
forming a plurality of interstage electrical connections on each said thermoelectric stage; and
forming an electrical path integral with said coupler and engagable with the interstage electrical connections for electrically connecting said stages together.

10. The method of claim 9 further including the step of soldering the electrical path of said coupler member to each interstage electrical connection.

11. The method of claim 8 wherein the metallized planes on each said first and said second thermoelectric stage is formed by connecting each first conductivity type element of said first thermoelectric stage to a second conductivity type element with a planar metal bridging elements, each bridging element being electrically and thermally conductive and constructed of a solderable surface;

forming the plurality of metallized areas on said coupler as individual isolated areas of a solderable surface; and
soldering the solderable surfaces of each said bridging element of each said first and second thermoelectric stage with an isolated area in registry therewith to thereby form a tiered thermoelectric unit.

12. The method of claim 8 wherein the electrically conductive path on said coupler is formed thereon by integrally attaching a metallized path around the edge of said coupler.

13. The method of claim 8 wherein the electrically conductive path on said coupler member is formed by forming an aperture in said coupler member and metallizing said aperture therethrough.

14. A thermoelectric unit employing a first and second thermoelectric stage of the type having a plurality of first conductivity type elements and a plurality of second conductivity type elements electrically connected alternatingly between said first conductivity type elements to form a series of thermal elements, comprising:
a first interstage electrical connection pad on said first stage;
a second interstage electrical connection pad on said second stage;
a unitary planar thermally conductive and electronically isolating coupler interposed between said first and said second thermoelectric stages;
an electrically conductive path on said coupler for connecting said first and said second interstage electrical connection pads together; and
means for bonding said interstage electrical connection pads of said first and said second thermoelectric stage to said conductive path to thereby form an electrical circuit and a thermally conductive path between said stages.

15. The thermoelectric unit of claim 14 further including:
a plurality of first electrical bridging elements between adjacent said first and second conductivity type elements of said first stage, said first bridging elements being formed in the same plane as said first interstage electrical connection pad;
a plurality of second electrical bridging elements disposed between adjacent first and second conductivity type elements of said second stage, said second bridging elements being formed in the same plane as said second interstage electrical connection pad;
a plurality of isolated metallized contact areas in thermal contact with and on opposing sides of said coupler, each said area being in registry with a respective one of said first or second electrical bridging elements; and
means for bonding each bridging element to an isolated said contact area in registry therewith.

16. The thermoelectric unit of claim 15 wherein said first and said second electrical bridging elements are bonded to respective isolated and metallized areas on said coupler member by a solder material.

17. The thermoelectric unit of claim 14 further including:
fixing all said first and second conductivity type elements of said first thermoelectric stage, in pairs;
an additional first conductivity type element to said first stage; and means for connecting said first interstage electrical connection pad to said additional first element.

18. The thermoelectric unit of claim 17 further including:
   an additional said second conductivity type element associated with said first stage unpaired with said additional first conductivity type element;
   an additional interstage electrical connection pad associated with said second stage;
   an additional interstage electrical connection pad associated with said additional second conductivity type element; and
   means for connecting both said additional interstage electrical connection pads together.

19. The thermoelectric unit of claim 15 wherein the electrically conductive path on said coupler comprise an integrally attached metallized path around the edge of said coupler.

20. The thermoelectric unit of claim 14 wherein the electrically conductive path on said coupler comprises an aperture in said coupler member and a conductive metal through said aperture.

21. A thermoelectric unit employing a first and second thermoelectric stage of the type having a plurality of first conductive type elements, a plurality of second conductive type elements electrically connected alternatingly between said first conductivity type elements to form a series of thermal elements, comprising:
   a first interstage electrical connection pad on said first stage;
   a second interstage electrical connection pad on said second stage;
   a plurality of metallized planes having high thermal conductivity disposed on each said thermoelectric stage;
   a plurality of metallized areas having high thermal conductivity disposed on said coupler and in registry with each said metallized plane;
   a unitary planar thermally conductive and electrically isolated coupler interposed between said first and said second thermoelectric stage; and
   means for bonding each said metallized plane with one of said metallized areas in registry therewith so as to provide a thermal path from one said thermoelectric stage to the other stage.

22. The thermoelectric unit of claim 21 further including:
   a plurality of interstage electrical connections on each said thermoelectric stage; and
   an electrical path integral with said coupler and engagable with the interstage electrical connections for electrically connecting said stages together.

23. The thermoelectric unit of claim 22 further including a solder connection for connecting the electrical path of said coupler member to each interstage electrical connection.

24. The thermoelectric unit of claim 21 wherein said metallized planes on each said first and said second thermoelectric stage comprises a connection from each first conductivity type element of said first thermoelectric stage to a second conductivity type element with a planar metal bridging element, each said bridging element being electrically and thermally conductive and constructed of a solderable surface;
   a plurality of metallized areas on said coupler defining individual idolated areas of a solderable surface; and
   a solder connection for soldering said solderable surfaces of each said bridging element of each said first and second thermoelectric stage with an isolated area in registry therewith to thereby form a tiered thermoelectric unit.

25. The thermoelectric unit of claim 21 wherein the electrically conductive path on said coupler comprises an integral attachment of a metallized path around the edge of said coupler.

26. The thermoelectric unit of claim 21 wherein the electrically conductive path on said coupler member comprises an aperture in said coupler member and a conductive metal formed through said aperture.

* * * * *

UNITED STATES PATENT AND TRADEMARK OFFICE
CERTIFICATE OF CORRECTION

PATENT NO. : 4,687,879
DATED : August 18, 1987
INVENTOR(S) : Terry J. Hendricks

It is certified that error appears in the above-identified patent and that said Letters Patent is hereby corrected as shown below:

Col. 9, line 15, (Claim 19, line 1) "claim 15" should be --claim 14--.

Col. 10, line 28, (Claim 24, line 10) "idolated" should be --isolated--.

Signed and Sealed this

First Day of December, 1987

Attest:

DONALD J. QUIGG

Attesting Officer      Commissioner of Patents and Trademarks